United States Patent
Taketani

(10) Patent No.: US 7,936,026 B2
(45) Date of Patent: May 3, 2011

(54) SEMICONDUCTOR DEVICE AND METHOD OF MANUFACTURING THE SAME

(75) Inventor: Hiroaki Taketani, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 81 days.

(21) Appl. No.: 12/098,117

(22) Filed: Apr. 4, 2008

(65) Prior Publication Data

US 2008/0251819 A1 Oct. 16, 2008

(30) Foreign Application Priority Data

Apr. 10, 2007 (JP) ................................. 2007-102493

(51) Int. Cl.
*H01L 29/72* (2006.01)
(52) U.S. Cl. ........ 257/411; 257/288; 257/383; 257/401; 257/410
(58) Field of Classification Search .................. 257/288, 257/383, 401, 410, 411
See application file for complete search history.

(56) References Cited

U.S. PATENT DOCUMENTS

| 6,191,463 | B1 * | 2/2001 | Mitani et al. | 257/411 |
| 2007/0298598 | A1 * | 12/2007 | Takeda et al. | 438/522 |
| 2008/0157219 | A1 * | 7/2008 | Fujiwara et al. | 257/383 |

FOREIGN PATENT DOCUMENTS

| JP | 05251463 | 9/1993 |
| JP | 2000269492 | 9/2000 |
| JP | 2005032864 | 2/2005 |

* cited by examiner

*Primary Examiner* — Edward Wojciechowicz
(74) *Attorney, Agent, or Firm* — Sughrue Mion, PLLC

(57) ABSTRACT

A semiconductor device may include a semiconductor substrate, a diffusion layer provided over the semiconductor substrate, source and drain diffusion regions provided in upper regions of the diffusion layer, a gate insulating film provided over the source and drain diffusion regions and the diffusion layer, a gate electrode provided on the gate insulating film and positioned over the diffusion layer, a passivation film provided over the gate insulating film and the gate electrode, an insulating film that covers the passivation film, and contact plugs that penetrate the insulating film, the passivation film, and the gate insulating film, so that the contact plugs reach the source and drain diffusion regions. The contact plugs are positioned near side walls of the gate electrode. Fluorine is implanted to the passivation film. Fluorine is diffused to a silicon-insulator interface between the gate insulating film and the diffusion layer under the gate electrode.

4 Claims, 6 Drawing Sheets

SEMICONDUCTOR DEVICE AND METHOD OF MANUFACTURING THE SAME

BACKGROUND OF THE INVENTION

1. Field of the Invention

The present invention generally relates to a semiconductor device and a method of manufacturing the same. More specifically, the present invention relates to an MOS semiconductor device having an interface between a semiconductor layer and an insulating layer, wherein the interface has a reduced interface state, and the MOS semiconductor device has suppressed variation of performances and reduced leakage of current.

Priority is claimed on Japanese Patent Application No. 2007-102493, filed Apr. 10, 2007, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

The MOS (Metal Oxide Semiconductor) semiconductor device includes a semiconductor substrate which has a device region which is defined and isolated by an insulating film. The insulating film has an interface with the semiconductor substrate or device region. The interface between semiconductor and insulator has an interface state that is caused by dangling bonds of semiconductor and lattice defects of semiconductor. The interface state performs as traps to carriers. The interface state may cause generation current and increase leakage of current unless the interface state is sufficiently reduced to suppress such generation current and leakage of current.

The MOS (Metal Oxide Semiconductor) semiconductor device also includes a gate insulating film which has an interface with the semiconductor substrate. The interface between the semiconductor substrate and the gate insulating film also has an interface state. The interface state may cause variation of threshold voltage over time and deteriorate the reliability of the semiconductor device.

In a memory cell of a dynamic random access memory (DRAM), increase of leakage of current or variation of threshold voltage may deteriorate refresh performance.

A conventional method for reducing interface state has been known, wherein a heat treatment is carried out in hydrogen atmosphere to terminate dangling bonds of silicon with hydrogen, thereby forming Si—H bonds at the terminals.

Si—H bonds are likely to be broken by thermal stress application and hot carrier injection, thereby generating dangling bonds. Another conventional method was proposed in order to prevent this phenomenon. In accordance with the other conventional method, fluorine is introduced into a silicon-insulator interface to form Si—F bonds which are higher in bonding force than Si—H bonds.

There are several methods of introducing fluorine. An ion-implantation is most convenient.

Japanese Unexamined Patent Application, First Publication, No. 2000-269492 discloses that after source and drain regions are formed, fluorine is ion-implanted into the entire surface of a silicon substrate and then a heat treatment is carried out, thereby terminating dangling bonds with fluorine.

Japanese Unexamined Patent Application, First Publication, No. 5-251463 discloses that after an LDD (Lightly Doped Drain) is formed by an ion-implantation and before side walls are formed, a silicon substrate is lamp-annealed in an atmosphere containing fluorine compounds, thereby introducing fluorine into a gate insulating film.

Japanese Unexamined Patent Application, First Publication, No. 2005-032864 discloses that at the same time of forming LDD or source/drain regions, fluorine or fluorine-compound is introduced into a gate electrode over a thicker gate insulating film.

Direct implantation of fluorine into a silicon substrate may generate a large number of point defects in the silicon substrate. Sufficient recovery of a large number of point defects needs high temperature heat treatment. Such high temperature heat treatment makes it difficult to realize the shrinkage of a semiconductor device. In practice, suppressing process temperature is needed for an advanced semiconductor device. Low temperature heat treatment that is suitable for realizing the shrinkage of a semiconductor device may cause insufficient recovery, thereby allowing point defects to reside in a depletion layer. Such residual point defects may cause junction leakage, thereby deteriorating the performance of a semiconductor device.

In view of the above, it will be apparent to those skilled in the art from this disclosure that there exists a need for an improved semiconductor device and/or a method of forming a semiconductor device. This invention addresses this need in the art as well as other needs, which will become apparent to those skilled in the art from this disclosure.

SUMMARY OF THE INVENTION

Accordingly, it is a primary object of the present invention to provide a semiconductor device with reduced interface state.

It is another object of the present invention to provide a semiconductor device with fluorine-introduced interface to suppress generation of defects and reduce interface state.

It is a further object of the present invention to provide a semiconductor device with reduced variation of performance.

It is a still further object of the present invention to provide a semiconductor device with reduced leakage of current.

It is yet a further object of the present invention to provide a method of forming a semiconductor device with reduced interface state.

It is an additional object of the present invention to provide a method of forming a semiconductor device with fluorine-introduced interface to suppress generation of defects and reduce interface state.

It is another object of the present invention to provide a method of forming a semiconductor device with reduced variation of performance.

It is still another object of the present invention to provide a method of forming a semiconductor device with reduced leakage of current.

In accordance with a first aspect of the present invention, a semiconductor device may include, but is not limited to, a semiconductor substrate, a diffusion layer provided over the semiconductor substrate, source and drain diffusion regions provided in upper regions of the diffusion layer, a gate insulating film provided over the source and drain diffusion regions and the diffusion layer, a gate electrode provided on the gate insulating film and positioned over the diffusion layer, a passivation film provided over the gate insulating film and the gate electrode, an insulating film that covers the passivation film, and contact plugs that penetrate the insulating film, the passivation film, and the gate insulating film, so that the contact plugs reach the source and drain diffusion regions. The contact plugs are positioned near side walls of the gate electrode. Fluorine is implanted to the passivation film. Fluorine is diffused to a silicon-insulator interface between the gate insulating film and the diffusion layer under the gate electrode.

In some cases, the passivation film may have a multi-layered structure which includes a silicon oxide film and a silicon nitride film over the silicon oxide film, and the silicon oxide film contains fluorine.

In some cases, the silicon oxide film may have a concentration of fluorine in the range of $1E18/cm^3$ to $1E22/cm^3$.

In some cases, the silicon-insulator interface may have fluorine that has been thermally diffused from the passivation film.

In accordance with a second aspect of the present invention, a method of forming a semiconductor device may include, but is not limited to the following processes. A diffusion layer is formed over a semiconductor substrate. Source and drain diffusion regions are formed in upper regions of the diffusion layer. A gate insulating film is formed over the source and drain diffusion regions and the diffusion layer. A gate electrode is formed on the gate insulating film. The gate electrode is positioned over the diffusion layer. A passivation film is formed over the gate insulating film and the gate electrode. An insulating film is formed, which covers the passivation film. Contact plugs are formed, which penetrate the insulating film, the passivation film, and the gate insulating film so that the contact plugs reach the source and drain diffusion regions. The contact plugs are positioned near side walls of the gate electrode. Fluorine is implanted into the passivation film. The fluorine is diffused to a silicon-insulator interface between the gate insulating film and the diffusion layer under the gate electrode.

In some cases, forming the passivation film may include forming a silicon oxide film over the gate insulating film and the gate electrode, and forming a silicon nitride film over the silicon oxide film. Introducing fluorine to the passivation film may include introducing fluorine to the silicon oxide film.

In some cases, introducing fluorine to the silicon oxide film may be carried out so that the silicon oxide film has a concentration of fluorine in the range of $1E18/cm^3$ to $1E22/cm^3$.

In some cases, diffusing the fluorine may include thermally diffusing the fluorine to the silicon-insulator interface after introducing fluorine to the passivation film.

In accordance with a third aspect of the present invention, a semiconductor device may include, but is not limited to, a fluorine-implanted side wall layer and a fluorine-introduced region. The fluorine-implanted side wall layer is adjacent to a side wall of a gate electrode. The fluorine-implanted side wall layer may include a stack of a silicon oxide film and a silicon nitride film. The fluorine-introduced region may be disposed in a semiconductor substrate. The fluorine-introduced region is positioned under the gate electrode. The fluorine-introduced region contains fluorine that has been diffused from the fluorine-implanted side wall layer.

In accordance with a fourth aspect of the present invention, a method of forming a semiconductor device may include, but is not limited to the following processes. A gate electrode and source and drain diffusion regions are formed over a semiconductor substrate. A passivation film is formed, which covers the gate electrode and the semiconductor substrate. The passivation film includes at least two insulating films. Fluorine is implanted into the passivation film. The fluorine is thermally diffused to a silicon-insulator interface between the gate insulating film and the diffusion layer under the gate electrode, after implanting fluorine into the passivation film.

In some cases, implanting fluorine into the passivation film may include implanting fluorine into the passivation film only.

In some cases, the method may further include, but is not limited to, forming an insulating film over the passivation film, forming a contact hole that penetrates the insulating film and the passivation film, and forming a conductive plug in the contact hole.

In accordance with the semiconductor device of the present invention, may include, but is not limited to, a semiconductor substrate, a diffusion layer provided over the semiconductor substrate, source and drain diffusion regions provided in upper regions of the diffusion layer, a gate insulating film provided over the source and drain diffusion regions and the diffusion layer, a gate electrode provided on the gate insulating film and positioned over the diffusion layer, a passivation film provided over the gate insulating film and the gate electrode, an insulating film that covers the passivation film, and contact plugs that penetrate the insulating film, the passivation film, and the gate insulating film, so that the contact plugs reach the source and drain diffusion regions. The contact plugs are positioned near side walls of the gate electrode. Fluorine is implanted to the passivation film. Fluorine is diffused to a silicon-insulator interface between the gate insulating film and the diffusion layer under the gate electrode. Fluorine at the silicon-insulator interface terminates dangling bonds on the silicon-insulator interface. The center of projected range of depth of the fluorine-ion-implantation is not positioned in a silicon region, for example, a diffusion layer of the semiconductor substrate, thereby reducing damages to the silicon region, for example, the diffusion layer of the semiconductor substrate. This also reduces the amount of fluorine that has been implanted into the silicon region, for example, the diffusion layer of the semiconductor substrate. Fluorine that is introduced into the silicon-insulator interface reduces interface state. This can reduce the leakage of current of a memory cell transistor of a DRAM and improve the refresh performance thereof when the semiconductor device is applied to the DRAM memory cell.

The passivation film may have a multi-layered structure which includes a silicon oxide film and a silicon nitride film over the silicon oxide film, and the silicon oxide film contains fluorine. The silicon nitride film can suppress outward diffusion of implanted fluorine from the silicon oxide film, while effectively introducing the implanted fluorine into the silicon-insulator interface during a heat treatment.

In some cases, the silicon oxide film may have a concentration of fluorine in the range of $1E18/cm^3$ to $1E22/cm^3$ which is sufficiently high to thermally diffuse the fluorine into the silicon-insulator interface, thereby effectively reducing the interface state of the silicon-insulator interface.

In some cases, the silicon-insulator interface may have fluorine that has been thermally diffused from the passivation film. The heat treatment that is carried out after implanting fluorine effectively and thermally diffuses the fluorine into the silicon-insulator interface.

In accordance with a method of forming a semiconductor device of the present invention may include, but is not limited to the following processes. A diffusion layer is formed over a semiconductor substrate. Source and drain diffusion regions are formed in upper regions of the diffusion layer. A gate insulating film is formed over the source and drain diffusion regions and the diffusion layer. A gate electrode is formed on the gate insulating film. The gate electrode is positioned over the diffusion layer. A passivation film is formed over the gate insulating film and the gate electrode. An insulating film is formed, which covers the passivation film. Contact plugs are formed, which penetrate the insulating film, the passivation film, and the gate insulating film so that the contact plugs reach the source and drain diffusion regions. The contact plugs are positioned near side walls of the gate electrode. Fluorine is implanted into the passivation film. The fluorine is diffused to a silicon-insulator interface between the gate insulating film and the diffusion layer under the gate electrode. Fluorine at the silicon-insulator interface terminates dangling bonds on the silicon-insulator interface. The center of projected range of depth of the fluorine-ion-implantation is not positioned in a silicon region, for example, a diffusion layer of the semiconductor substrate, thereby reducing damages to the silicon region, for example, the diffusion layer of the semiconductor substrate. This also reduces the amount of fluorine that has been implanted into the silicon region, for example, the diffusion layer of the semiconductor substrate. Fluorine that is introduced into the silicon-insulator interface reduces interface state. This can reduce the leakage of current of a memory cell transistor of a DRAM and improve the refresh performance thereof when the semiconductor device is applied to the DRAM memory cell.

In some cases, forming the passivation film may include forming a silicon oxide film over the gate insulating film and the gate electrode, and forming a silicon nitride film over the silicon oxide film. Introducing fluorine to the passivation film may include introducing fluorine to the silicon oxide film. The silicon nitride film can suppress outward diffusion of implanted fluorine from the silicon oxide film, while effectively introducing the implanted fluorine into the silicon-insulator interface during a heat treatment.

In some cases, introducing fluorine to the silicon oxide film may be carried out so that the silicon oxide film has a concentration of fluorine in the range of $1E18/cm^3$ to $1E22/cm^3$ which is sufficiently high to thermally diffuse the fluorine into the silicon-insulator interface, thereby effectively reducing the interface state of the silicon-insulator interface.

In some cases, diffusing the fluorine may include thermally diffusing the fluorine to the silicon-insulator interface after introducing fluorine to the passivation film. The heat treatment that is carried out after implanting fluorine effectively and thermally diffuses the fluorine into the silicon-insulator interface.

In accordance with a semiconductor device of the present invention may include, but is not limited to, a fluorine-implanted side wall layer and a fluorine-introduced region. The fluorine-implanted side wall layer is adjacent to a side wall of a gate electrode. The fluorine-implanted side wall layer may include a stack of a silicon oxide film and a silicon nitride film. The fluorine-introduced region may be disposed in a semiconductor substrate. The fluorine-introduced region is positioned under the gate electrode. The fluorine-introduced region contains fluorine that has been diffused from the fluorine-implanted side wall layer. Fluorine in the fluorine-introduced region terminates dangling bonds in the fluorine-introduced region. The center of projected range of depth of the fluorine-ion-implantation is not positioned in the fluorine-introduced region, thereby reducing damages to the fluorine-introduced region. This also reduces the amount of fluorine that has been implanted into the semiconductor substrate. Fluorine that is introduced into the fluorine-introduced region reduces interface state. This can reduce the leakage of current of a memory cell transistor of a DRAM and improve the refresh performance thereof when the semiconductor device is applied to the DRAM memory cell.

In accordance with a method of forming a semiconductor device of the present invention may include, but is not limited to the following processes. A gate electrode and source and drain diffusion regions are formed over a semiconductor substrate. A passivation film is formed, which covers the gate electrode and the semiconductor substrate. The passivation film includes at least two insulating films. Fluorine is implanted into the passivation film. The fluorine is thermally diffused to a silicon-insulator interface between the gate insulating film and the diffusion layer under the gate electrode, after implanting fluorine into the passivation film. Fluorine at the silicon-insulator interface terminates dangling bonds on the silicon-insulator interface. The center of projected range of depth of the fluorine-ion-implantation is not positioned in a silicon region, for example, a diffusion layer of the semiconductor substrate, thereby reducing damages to the silicon region, for example, the diffusion layer of the semiconductor substrate. This also reduces the amount of fluorine that has been implanted into the silicon region, for example, the diffusion layer of the semiconductor substrate. Fluorine that is introduced into the silicon-insulator interface reduces interface state. This can reduce the leakage of current of a memory cell transistor of a DRAM and improve the refresh performance thereof when the semiconductor device is applied to the DRAM memory cell.

In some cases, implanting fluorine into the passivation film may include implanting fluorine into the passivation film only.

In some cases, the method may further include, but is not limited to, forming an insulating film over the passivation film, forming a contact hole that penetrates the insulating film and the passivation film, and forming a conductive plug in the contact hole.

These and other objects, features, aspects, and advantages of the present invention will become apparent to those skilled in the art from the following detailed descriptions taken in conjunction with the accompanying drawings, illustrating the embodiments of the present invention.

BRIEF DESCRIPTION OF THE DRAWINGS

Referring now to the attached drawings which form a part of this original disclosure.

DETAILED DESCRIPTION OF THE INVENTION

Selected embodiments of the present invention will now be described with reference to the drawings. It will be apparent to those skilled in the art from this disclosure that the following descriptions of the embodiments of the present invention are provided for illustration only and not for the purpose of limiting the invention as defined by the appended claims and their equivalents.

In some cases, the invention can be applicable to, but not limited to, a n-type MOSFET (metal oxide semiconductor field effect transistor) that performs as a memory cell transistor in a DRAM.

Figure 6:
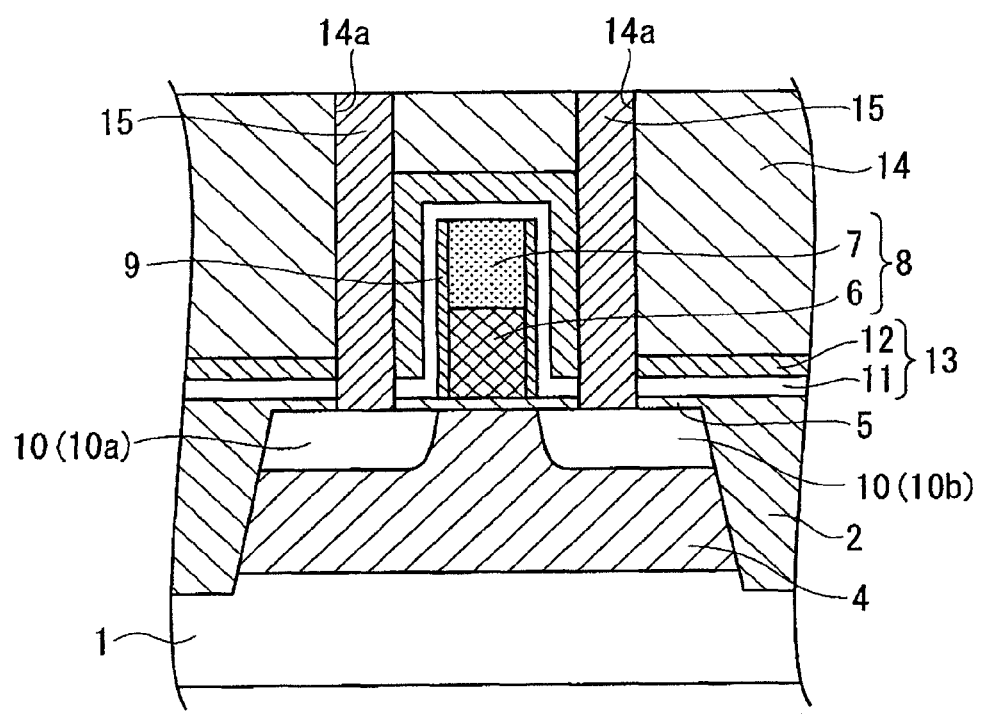
FIG. 6 is a fragmentary cross sectional elevation view illustrating a memory cell transistor in accordance with a first embodiment of the present invention.
Figure 9:
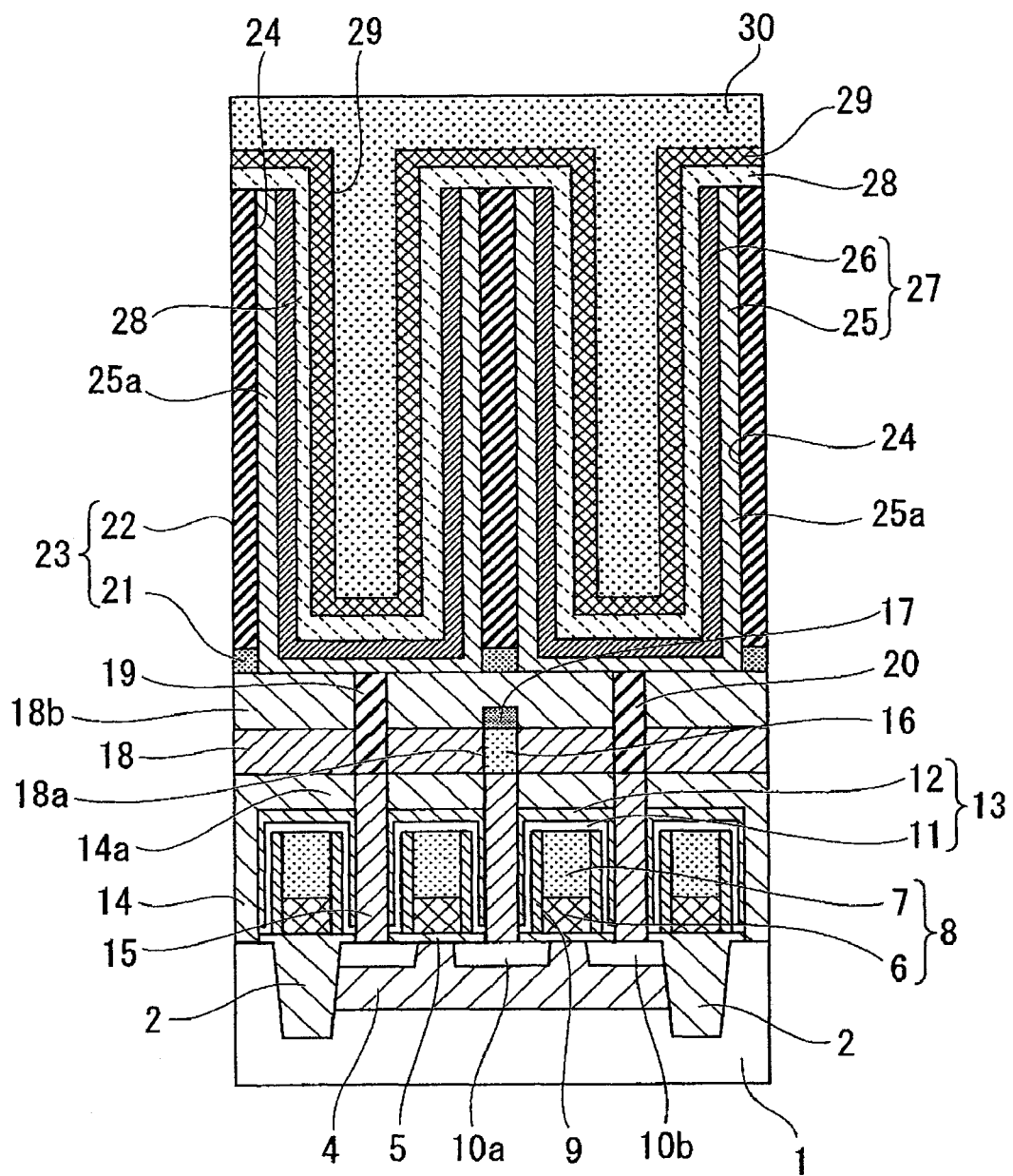
FIG. 9 is a fragmentary cross sectional elevation view illustrating a memory cell structure of a DRAM, including the memory cell transistor of FIG. 6, in accordance with a first embodiment of the present invention.

FIG. 6 is a fragmentary cross sectional elevation view illustrating a memory cell transistor in accordance with a first embodiment of the present invention. FIG. 9 is a fragmentary cross sectional elevation view illustrating a memory cell structure of a DRAM, including the memory cell transistor of FIG. 6, in accordance with a first embodiment of the present invention.

A semiconductor substrate 1 is made of a semiconductor such as silicon that has a predetermined concentration of an impurity. An insulating film 2 is selectively formed in an upper region of the semiconductor substrate 1. The insulating film 2 performs as a device isolation region. The insulating film 2 defines a transistor region for forming a transistor thereon. The transistor performs as a switching transistor in a memory cell of the DRAM. The insulating film 2 is provided to isolate the transistor.

In the transistor region of the substrate 1, a p-type diffusion layer 4 is formed which is defined by the insulating film 2. A gate insulating film 5 is formed which covers the insulating film 2 and the p-type diffusion layer 4.

A gate electrode 8 is formed on the gate insulating film 5, so that the gate electrode 8 is positioned over a part of the p-type diffusion layer 4. n-type diffusion layers 10 are formed in upper regions of the p-type diffusion layer 4, except under the gate electrode 8. The n-type diffusion layers 10 may be a pair of source and drain diffusion regions 10a and 10b. The source diffusion region 10a is connected to a bit line which will be described below. The drain diffusion region 10b is connected to a memory cell capacitor which will be described below.

The gate electrode 8 may have a multi-layer structure. A typical example of the multi-layer structure of the gate electrode 8 may include, but is not limited to, a stack of a polycrystalline silicon film 6 and a metal film 7, wherein the polycrystalline silicon film 6 is formed over the gate insulating film 5 and the metal film 7 is formed over the polycrystalline silicon film 6. A typical example of the polycrystalline silicon film 6 may include, but is not limited to, a doped polycrystalline silicon film which is formed by introducing an impurity into a polycrystalline silicon film being formed by a chemical vapor deposition (CVD) method. A typical example of the metal film 7 may include, but is not limited to, a tungsten silicide (WSi) film 7. Other examples of the metal film 7 may include, but is not limited to, a tungsten silicide (W) film or refractory metal films.

Side wall insulating films 9 are formed on side walls of the gate electrode 8. Typical examples of the side wall insulating films 9 may include, but are not limited to, a silicon oxide film and a silicon nitride film. A passivation film 13 is formed over the gate insulating film 5 and the gate electrode 8. The passivation film 13 extends over the gate insulating film 5, the surfaces of the side wall insulating films 9, and the top surface of the gate electrode 8. In some cases, the passivation film 13 may have a multi-layer structure. A typical example of the multi-layer structure of the passivation film 13 may include, but is not limited to, a stack of a first silicon oxide film 11 and a silicon nitride film 12. The first silicon oxide film 11 is formed on the gate insulating film 5, the surfaces of the side wall insulating films 9, and the top surface of the gate electrode 8. The silicon nitride film 12 is formed over the first silicon oxide film 11. A second silicon oxide film 14 is formed over the passivation film 13.

The first silicon oxide film 11 has an interface with the silicon nitride film 12. Florien is introduced into the interface between the first silicon oxide film 11 has an interface with the silicon nitride film 12. A heat treatment is carried out to cause a thermal diffusion of introduced fluorine to a silicon-insulator interface between the gate insulating film 5 and the source and drain diffusion regions 10a and 10b. Namely, fluorine is introduced into the silicon-insulator interface between the gate insulating film 5 and the source and drain diffusion regions 10a and 10b.

In some cases, the first silicon oxide film 11 may preferably have a thickness in the range of 10 nanometers to 20 nanometers. The silicon nitride film 12 may preferably have a thickness in the range of 10 nanometers to 30 nanometers.

Contact holes 14a are formed which penetrate the second silicon oxide film 14, the passivation film 13, and the gate insulating film 5, wherein the contact holes 14a reach the source and drain diffusion regions 10a and 10b. The contact holes 14a are adjacent to vertically extending portions of the passivation film 13, wherein the vertically extending portions of the passivation film 13 cover the side wall insulating films 9.

As shown in FIG. 9, the DRAM has a memory cell structure. The memory cell structure has an active region of the semiconductor substrate 1, wherein the active region is defined by a buried insulating film 2 which is formed in an upper region of the semiconductor substrate 1. A two-bit memory cell is provided in each active region of the semiconductor substrate 1. Each active region is surrounded by the buried insulating film 2. A p-type diffusion layer 4 is disposed which is defined by the insulating film 2. A gate insulating film 5 is disposed which covers the insulating film 2 and the p-type diffusion layer 4. Impurity diffusion layers are selectively formed at a center position and side positions in each active region. Namely, a source diffusion region 10a is positioned at the center position of the active region. Drain diffusion regions 10b are positioned at side positions of the active region.

Gate electrodes 8 are disposed on the gate insulating film 5. The gate electrodes 8 are positioned over the p-type diffusion layer 4. The gate electrode 8 has a multi-layer structure of a tack of a polycrystalline silicon film 6 and a metal film 7.

Side wall insulating films 9 are disposed on side walls of each of the gate electrodes 8. A passivation film 13 is disposed over the gate insulating film 5 and the gate electrodes 8. The passivation film 13 extends over the gate insulating film 5, the surfaces of the side wall insulating films 9, and the top surfaces of the gate electrodes 8. The passivation film 13 has a multi-layer structure of a stack of a first silicon oxide film 11 and a silicon nitride film 12. A second silicon oxide film 14 extends over the passivation film 13. Contact holes 14a penetrate the second silicon oxide film 14, the passivation film 13, and the gate insulating film 5, wherein the contact holes 14a reach the source and drain diffusion regions 10a and 10b. The contact holes 14a are adjacent to vertically extending portions of the passivation film 13, wherein the vertically extending portions of the passivation film 13 cover the side wall insulating films 9. Polycrystalline silicon plugs 15 are disposed in the contact holes 14a. The polycrystalline silicon plugs 15 contact with the source and drain diffusion regions 10a and 10b.

A first inter-layer insulator 18 extends over the second silicon oxide film 14 and the polycrystalline silicon plugs 15. A typical example of the first inter-layer insulator 18 may include, but is not limited to, a silicon oxide film.

A bit contact hole 18a penetrates the first inter-layer insulator 18. The bit contact hole 18a reaches the top of the polycrystalline silicon plug 15 which contacts with the source diffusion region 10a. A bit contact plug 16 is formed in the bit contact hole 18a, so that the bit contact plug 16 contacts with the top of the polycrystalline silicon plug 15 which contacts with the source diffusion region 10a.

A bit line 17 extends over the first inter-layer insulator 18, wherein the bit line 17 contacts with the top of the bit contact plug 16. The bit line 17 is electrically connected through the bit contact plug 16 and the polycrystalline silicon plug 15 to the source diffusion region 10a. In some cases, the bit line 17 may be realized by, but not limited to, a metal film such as a tungsten film.

A second inter-layer insulator 18b extends over the first inter-layer insulator 18 and the bit line 17. A typical example of the second inter-layer insulator 18b may include, but is not limited to, a silicon oxide film which is formed by a plasma enhanced chemical vapor deposition (plasma-CVD) method.

Capacitor contact holes 19 penetrate the stack of the second and first inter-layer insulators 18b and 18. The capacitor contact holes 19 reach the tops of the polycrystalline silicon plugs 15 which contact with the drain diffusion regions 10b. Capacitor contact plugs 20 penetrate the capacitor contact holes 19. The capacitor contact plugs 20 contact with the tops of the polycrystalline silicon plugs 15 which contact with the drain diffusion regions 10b. The capacitor contact plugs 20 are electrically connected through the polycrystalline silicon plugs 15 to the drain diffusion regions 10b. A typical example of the capacitor contact plugs 20 may include, but is not limited to, a polycrystalline silicon film having a predetermined impurity concentration.

A third inter-layer insulator 23 extends over the second inter-layer insulator 18b and the capacitor contact plugs 20. A typical example of the third inter-layer insulator 23 may include, but is not limited to, a silicon nitride film 21 and a third silicon oxide film 22. The third silicon oxide film 22 performs as the cores of cylinders for capacitors. The silicon nitride film 21 performs as an etching stopper in forming a capacitor hole.

A capacitor hole 24 is disposed in the third inter-layer insulator 23. The capacitor hole 24 is cylindrically shaped. The capacitor hole 24 reaches the capacitor contact plugs 20 and the second inter-layer insulator 18b. The capacitor hole 24 has an inside wall and an outside wall as all as a ring-shaped bottom. A bottom electrode 27 is disposed along the inside and outside walls and the ring-shaped bottom of the capacitor hole 24. The bottom electrode 27 contacts with the capacitor contact plugs 20. The bottom electrode 27 is electrically connected through the capacitor contact plugs 20 and the polycrystalline silicon plugs 15 to the drain diffusion regions 10b. A typical example of the bottom electrode 27 may include, but is not limited to, a stack of an impurity-doped silicon film 25 and a metal bottom electrode film 26. The impurity-doped silicon film 25 extends along the inside and outside walls and the ring-shaped bottom of the capacitor hole 24. The metal bottom electrode film 26 is stacked on the impurity-doped silicon film 25.

The impurity-doped silicon film 25 may includes a silicide layer 25a which interfaces with the metal bottom electrode film 26. The silicide layer 25a may be formed by a silicidation reaction between silicon atoms of the impurity-doped silicon film 25 and the metal of the metal bottom electrode film 26. The silicide layer 25a performs as a low resistive film that reduces electrical contact between the capacitor and the capacitor contact plug.

A capacitive insulation film 28 is disposed on the surface of the bottom electrode 27 and over the third inter-layer insulator 23. Namely, the capacitive insulation film 28 extends along the bottom electrode 27. A top electrode 29 is disposed on the surface of the capacitive insulation film 28. Namely, the top electrode 29 extends along the capacitive insulation film 28. The capacitive insulation film 28 is sandwiched or interposed between the bottom and top electrodes 27 and 29. A stack of the bottom electrode 27, the capacitive insulation film 28 and the top electrode 29 does not completely fill up the capacitor hole 24. In other words, a cylindrically shaped groove resides in the capacitor hole 24 after the stack of the bottom electrode 27, the capacitive insulation film 28 and the top electrode 29 is formed in the capacitor hole 24. In the capacitor hole 24, the cylindrically shaped groove is defined by the stack of the bottom electrode 27, the capacitive insulation film 28 and the top electrode 29.

A capacitive plate 30 fills up the cylindrically shaped groove residing in the capacitor hole 24. The capacitive plate 30 extends over the top surface of the top electrode 29 being positioned over the third inter-layer insulator 23. A memory cell capacitor is constituted by, but not limited to, a set of the bottom electrode, 27, the capacitive insulation film 28, the top electrode 29, and the capacitive plate 30.

Figure 1:
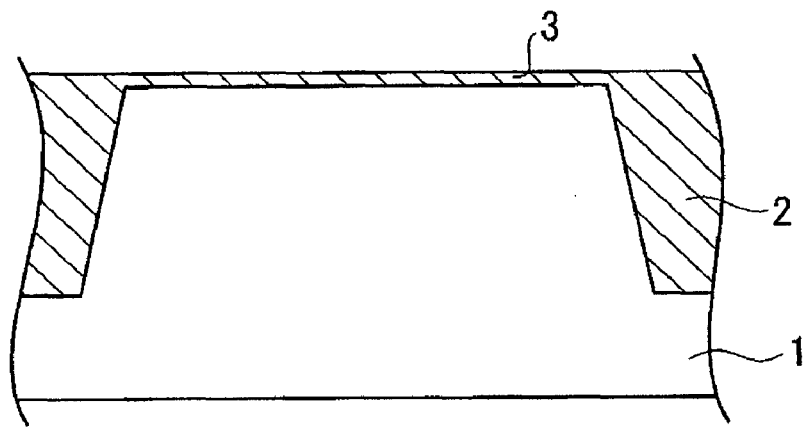
FIG. 1 is a fragmentary cross sectional elevation view illustrating a semiconductor device in a step involved in a method of forming the semiconductor device of FIG. 9.
Figure 2:
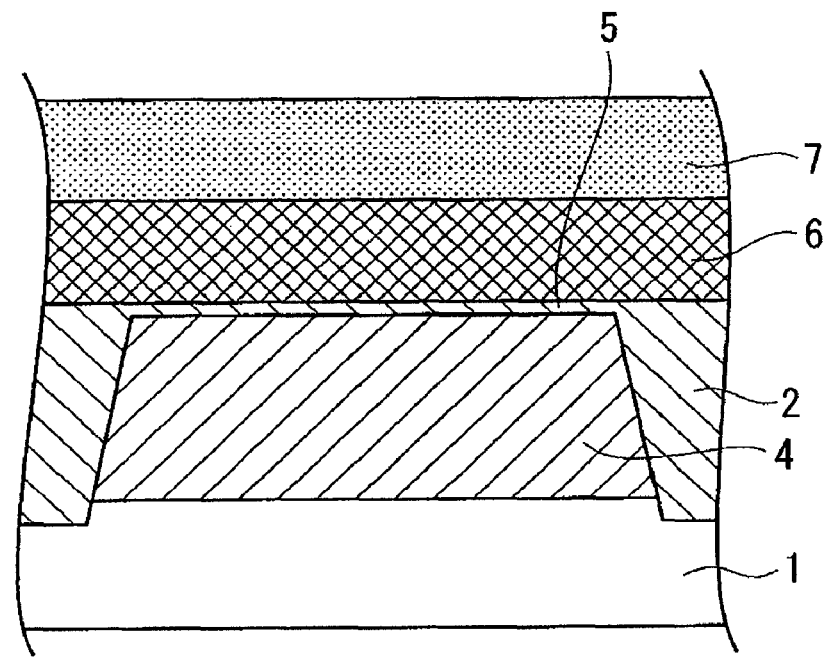
FIG. 2 is a fragmentary cross sectional elevation view illustrating a semiconductor device in a step subsequent to the step of FIG. 1, involved in the method of forming the semiconductor device of FIG. 9.
Figure 3:
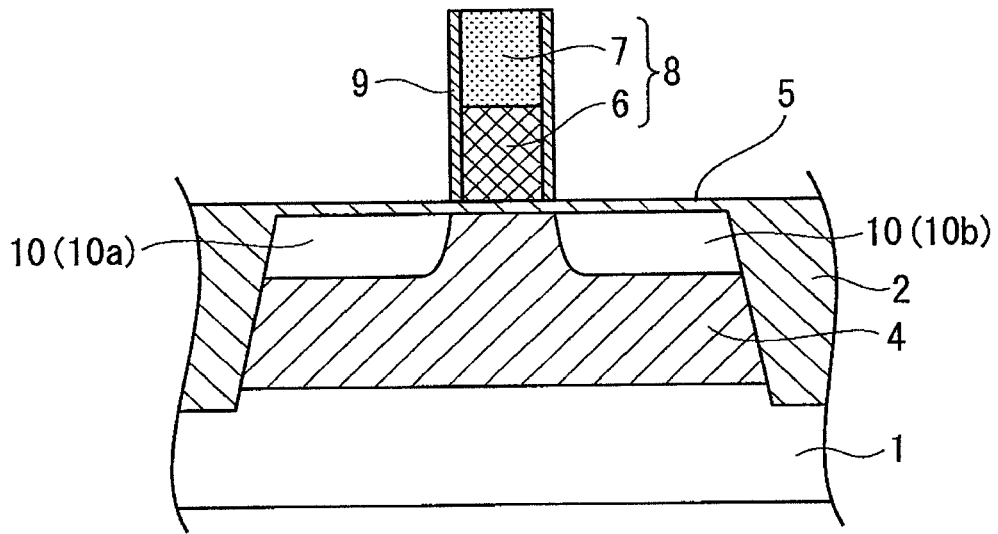
FIG. 3 is a fragmentary cross sectional elevation view illustrating a semiconductor device in a step subsequent to the step of FIG. 2, involved in the method of forming the semiconductor device of FIG. 9.
Figure 4:
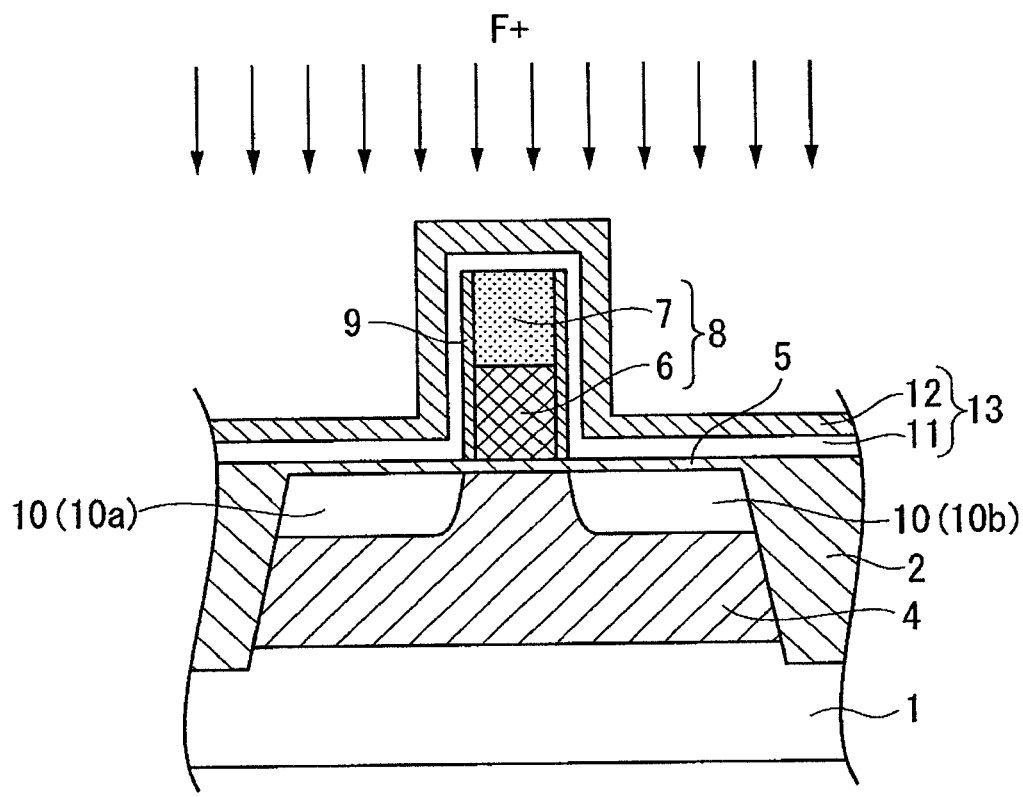
FIG. 4 is a fragmentary cross sectional elevation view illustrating a semiconductor device in a step subsequent to the step of FIG. 3, involved in the method of forming the semiconductor device of FIG. 9.
Figure 5:
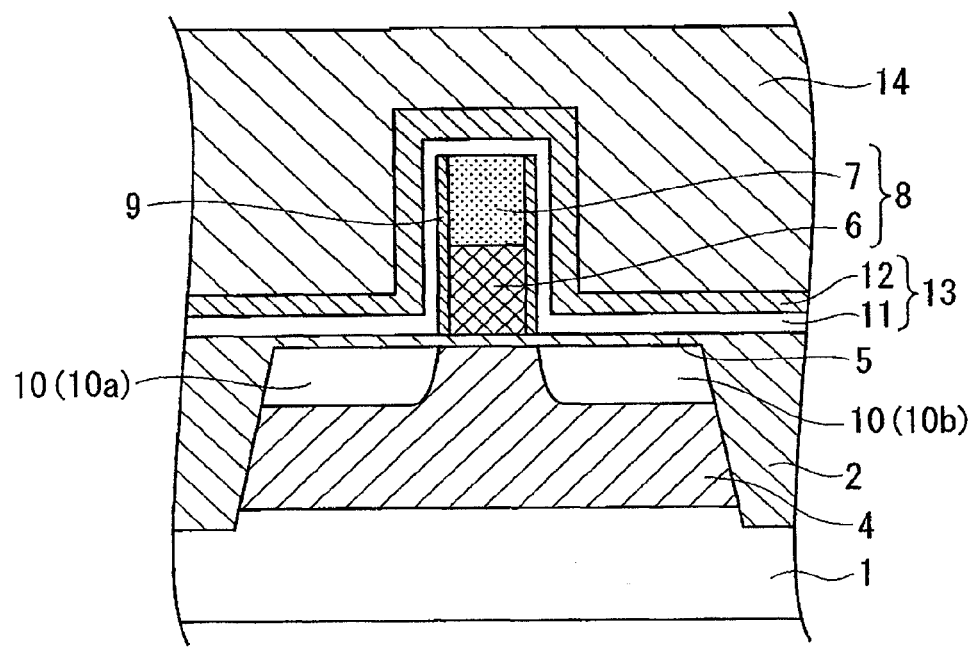
FIG. 5 is a fragmentary cross sectional elevation view illustrating a semiconductor device in a step subsequent to the step of FIG. 4, involved in the method of forming the semiconductor device of FIG. 9.
Figure 7:
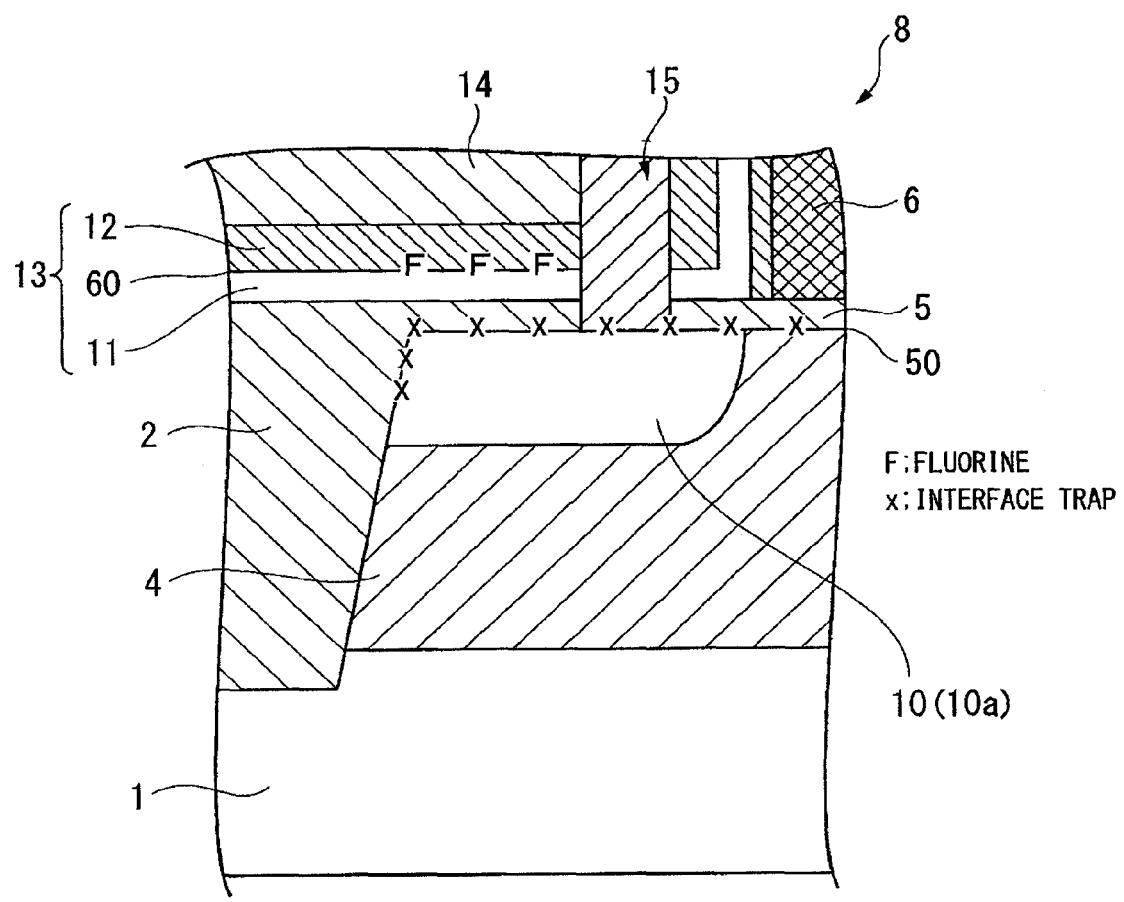
FIG. 7 is a fragmentary enlarged cross sectional elevation view illustrating a semiconductor device in a step subsequent to the step of FIG. 6, involved in the method of forming the semiconductor device of FIG. 9.

A method of forming the memory cell structure of the DRAM will be described with reference to FIGS. 1-7, and 9. FIG. 1 is a fragmentary cross sectional elevation view illustrating a semiconductor device in a step involved in a method of forming the semiconductor device of FIG. 9. FIG. 2 is a fragmentary cross sectional elevation view illustrating a semiconductor device in a step subsequent to the step of FIG. 1, involved in the method of forming the semiconductor device of FIG. 9. FIG. 3 is a fragmentary cross sectional elevation view illustrating a semiconductor device in a step subsequent to the step of FIG. 2, involved in the method of forming the semiconductor device of FIG. 9. FIG. 4 is a fragmentary cross sectional elevation view illustrating a semiconductor device in a step subsequent to the step of FIG. 3, involved in the method of forming the semiconductor device of FIG. 9. FIG. 5 is a fragmentary cross sectional elevation view illustrating a semiconductor device in a step subsequent to the step of FIG. 4, involved in the method of forming the semiconductor device of FIG. 9. FIG. 7 is a fragmentary enlarged cross sectional elevation view illustrating a semiconductor device in a step subsequent to the step of FIG. 6, involved in the method of forming the semiconductor device of FIG. 9.

With reference to FIG. 1, a silicon substrate 1 is prepared. A groove is formed in a shallow portion of the silicon substrate 1. The groove isolates or defines an active region of the silicon substrate 1. A buried insulating film 2 is formed in the groove of the silicon substrate 1 so as to isolate the active region of the silicon substrate 1. A silicon oxide film 3 is formed on the surface of the silicon substrate 1. In some cases, the silicon oxide film 3 may be formed by a thermal oxidation process. In some cases, the silicon oxide film 3 may have a thickness of 10 nanometers. An ion-implantation process is carried out to introduce boron into the active region of the silicon substrate 1 through the silicon oxide film 3, thereby forming a p-type diffusion layer 4 in the active region of the semiconductor substrate 1. The ion-implantation process can be carried out under different conditions. Namely, first to third ion-implantation processes are carried out to form the p-type diffusion layer 4. The first ion-implantation process may be carried out at acceleration energy of 300 keV and a dose of $1E13/cm^2$. The second ion-implantation process may be carried out at acceleration energy of 100 keV and a dose of $5E12/cm^2$. The third ion-implantation process may be carried out at acceleration energy of 15 keV and a dose of $1E13/cm^2$.

With reference to FIG. 2, after the silicon oxide film 3 is removed, a gate insulating film 5 is formed on the surface of the p-type diffusion layer 4. In some cases, the gate insulating film 5 may have a thickness of 7 nanometers. A polycrystalline silicon film 6 is formed over the gate insulating film 5. In some cases, the polycrystalline silicon film 6 may be doped with phosphorus at a high concentration. In some cases, the polycrystalline silicon film 6 may have a thickness of 70 nanometers. A tungsten silicide film 7 is formed over the polycrystalline silicon film 6. In some cases, the tungsten silicide film 7 may have a thickness of 100 nanometers.

With reference to FIG. 3, a stack of the tungsten silicide film 7 and the polycrystalline silicon film 6 is selectively removed by patterning process, thereby forming a gate electrode 8. The gate electrode 8 is constituted by the residual portion of the stack of the tungsten silicide film 7 and the polycrystalline silicon film 6. Side wall insulating films 9 are formed on the side walls of the gate electrode 8 by a thermal oxidation process. In some cases, the side wall oxide films 9 have a thickness of about 10 nanometers. The gate electrode 8 and the gate side walls 9 are used as a mask to selectively introduce an n-type impurity into the p-type diffusion layer 4 through the gate insulating film 5. The selective introduction can be realized by an ion-implantation of phosphorus through the gate insulating film 5 into shallow portions of the p-type diffusion layer 4 using the gate electrode 8 and the gate side walls 9 as a mask. In some cases, the ion-implantation of phosphorus can be carried out at acceleration energy of 20 keV and a dose of $1E13/cm^2$. A heat treatment is then carried out for 10 seconds at 900° C. in a nitrogen atmosphere, thereby causing thermal diffusion of implanted phosphorus and forming n-type diffusion regions 10 in the p-type diffusion layer 4. The n-type diffusion regions 10 perform as source and drain diffusion regions 10a and 10b.

With reference to FIG. 4, a first silicon oxide film 11 is formed which covers the gate insulating film 5, the side wall insulating films 9 and the gate electrode 8. In some cases, the first silicon oxide film 11 may have a thickness of 10 nanometers. A silicon nitride film 12 is formed on the first silicon oxide film 11. In some cases, the silicon nitride film 12 may have a thickness of 20 nanometers, thereby forming a stack of the first silicon oxide film 11 and the silicon nitride film 12. The stack of the first silicon oxide film 11 and the silicon nitride film 12 performs as a passivation film 13 which covers the gate insulating film 5, the side wall insulating films 9 and the gate electrode 8. The passivation film 13 has the double layered structure. The passivation film 13 has an interface between the first silicon oxide film 11 and the silicon nitride film 12.

Fluorine ions are introduced into the interface between the first silicon oxide film 11 and the silicon nitride film 12 in the passivation film 13. In some cases, fluorine is ion-implanted into the passivation film 13. A heat treatment is carried out to cause a thermal diffusion of the implanted fluorine into a silicon-insulator interface between the gate insulating film 5 and the diffusion region 10 and the p-type diffusion layer 4 under the gate electrode 8. Fluorine-introduction into the silicon-insulator interface reduces dangling bonds on the silicon-insulator interface. It is significant that the fluorine-introduction into the silicon-insulator interface reduces dangling bonds under the gate electrode 8, thereby adjusting a threshold Vt of the transistor.

The implanted fluorine is thermally diffused to the silicon-insulator interface 50 between the gate insulating film 5 and the diffusion region 10 and the p-type diffusion layer 4 under the gate electrode 8, while the silicon nitride film 12 suppresses outward diffusion of the implanted fluorine from the interface through the silicon nitride film 12. Namely, the silicon nitride film 12 performs as an outward diffusion stopper and as an impurity confiner that prevents the implanted fluorine from being diffused outwardly from the interface between the first silicon oxide film 11 and the silicon nitride film 12. The silicon nitride film 12 allows efficiently introducing fluorine into the interface between the first silicon oxide film 11 and the silicon nitride film 12.

It is possible as a modification that the passivation film 13 has either a single layered structure or a multi-layered structure. The passivation film 13 that consists of the first silicon oxide film 11 allows the heat treatment to cause outward diffusion of the implanted fluorine as gasified. The passivation film 13 that includes the first silicon oxide film 11 and the silicon nitride film 12 can prevent the heat treatment from causing outward diffusion of the implanted fluorine. In some cases, the double-layered structure of the first silicon oxide film 11 and the silicon nitride film 12 may be preferable, in view of both preventing the outward diffusion of the implanted fluorine in the heat treatment and simplifying the layered structure of the passivation film 13.

In some cases, the fluorine-ion-implantation can be carried out at acceleration energy of 10 keV and a dose of $1E14/cm^2$, where the center of projected range of depth of the fluorine-ion-implantation may be adjusted to the interface between the first silicon oxide film 11 and the silicon nitride film 12.

In some cases, the acceleration energy may be preferably in the range of 5 keV to 15 keV, and more preferably in the range of 8 keV to 12 keV. The dose may be preferably in the range of $1E13/cm^2$ to $1E16/cm^2$, and more preferably in the range of $1E14/cm^2$ to $1E15/cm^2$. Fluorine can be preferably ion-implanted into the passivation film 13 so that the first silicon oxide film 11 has a fluorine-concentration in the range of $1E18/cm^3$ to $1E22/cm^3$.

Whereas it may be preferable that the center of projected range of depth of the fluorine-ion-implantation is positioned at the interface between the first silicon oxide film 11 and the silicon nitride film 12, it may be possible that the center of projected range of depth of the fluorine-ion-implantation is positioned so that the fluorine is ion-implanted into the first silicon oxide film 11. This ion-implantation of fluorine into the silicon oxide film 11 or the interface between the silicon oxide film 11 and the silicon nitride film 12 causes no damage or reduced damage that is applied to silicon in the source and drain diffusion regions 10a and 10b. The center of projected range of depth of the fluorine-ion-implantation can be adjusted with reference to the thickness of the passivation film 13, the acceleration energy, and the dose.

Subsequently, a heat treatment is carried out so as to cause that the implanted fluorine in the first silicon oxide film 11 or the interface between the first silicon oxide film 11 and the silicon nitride film 12 is thermally diffused to the silicon-insulator interface between the gate insulating film 5 and the source and drain diffusion regions 10a and 10b and the p-type diffusion region 4 under the gate electrode 8. Namely, a heat treatment is carried out to cause a thermal diffusion of the implanted fluorine into a silicon-insulator interface between the gate insulating film 5 and the diffusion region 10 and the p-type diffusion layer 4 under the gate electrode 8. Fluorine-introduction into the silicon-insulator interface reduces dangling bonds on the silicon-insulator interface. It is significant that the fluorine-introduction into the silicon-insulator interface reduces dangling bonds under the gate electrode 8, thereby adjusting a threshold Vt of the transistor. In some cases, the heat treatment can be carried out, but not limited to, at 700° C. for 60 minutes. A typical example of the preferable temperature range of the heat treatment may be, but not limited to, 600° C. to 700° C. A typical example of the preferable time period of the heat treatment may be, but not limited to, 20 minutes to 120 minutes.

The silicon-insulator interface between the gate insulating film 5 and the source and drain diffusion regions 10a and 10b has dangling bonds or silicon-hydrogen bonds. The dangling bonds of the silicon-insulator interface between the gate insulating film 5 and the source and drain diffusion regions 10a and 10b are terminated during the heat treatment by fluorine that reaches or diffuses to the silicon-insulator interface from the first silicon oxide film 11 or the interface between the first silicon oxide film 11 and the silicon nitride film 12. The silicon-hydrogen bonds of the silicon-insulator interface are substituted by silicon-fluorine bonds, wherein hydrogen is substituted by fluorine that reaches or diffuses to the silicon-insulator interface during the heat treatment. During the heat treatment, the silicon nitride film 12 performs as an outward diffusion stopper and as an impurity confiner that prevents the implanted fluorine from being diffused outwardly from the interface between the first silicon oxide film 11 and the silicon nitride film 12. The silicon nitride film 12 allows efficiently introducing fluorine to the silicon-insulator interface between the gate insulating film 5 and the source and drain diffusion regions 10a and 10b from the interface between the first silicon oxide film 11 and the silicon nitride film 12.

With reference to FIG. 5, a second silicon oxide film 14 is formed over the passivation film 13.

With reference to FIG. 6, contact holes 14a are formed by patterning process, so that the contact holes 14a penetrate the second silicon oxide film 14, the passivation film 13, and the gate insulating film 5. The contact holes 14a reach the source and drain diffusion regions 10a and 10b. The contact holes 14a are adjacent to vertically extending portions of the passivation film 13, wherein the vertically extending portions of the passivation film 13 cover the side wall insulating films 9. A polycrystalline silicon film is deposited to fill up the contact holes 14a and to extend over the second silicon oxide film 14. The polycrystalline silicon film is etched back to remove the polycrystalline silicon film over the second silicon oxide film 14, while leaving the polycrystalline silicon film in the contact holes 14a, thereby forming polycrystalline silicon plugs 15 in the contact holes 14a. The polycrystalline silicon plugs 15 contact with the source and drain diffusion regions 10a and 10b.

With reference to FIG. 7, "F" represents fluorine that has been ion-implanted into the interface 60 between the first silicon oxide film 11 and the silicon nitride film 12. "X" represents interface states of the silicon-insulator interface 50 between the gate insulating film 5 and the source/drain diffusion region 10 (10a) and the p-type diffusion region under the gate electrode 8. The silicon-insulator interface 50 between the gate insulating film 5 and the source/drain diffusion region 10 (10a) and the p-type diffusion region under the gate electrode 8 has dangling bonds or silicon-hydrogen bonds. The implanted fluorine "F" on the interface 60 between the first silicon oxide film 11 and the silicon nitride film 12 is thermally diffused by the heat treatment to the silicon-insulator interface 50 between the gate insulating film 5 and the source/drain diffusion region 10 (10a) and the p-type diffusion region under the gate electrode 8, while the silicon nitride film 12 preventing the outward thermal diffusion of the implanted fluorine "F". The thermally diffused fluorine that reaches the silicon-insulator interface 50 can terminate the dangling bond of the silicon-insulator interface 50, thereby reducing the interface state of the silicon-insulator interface 50 under the gate electrode 8. Fluorine-introduction into the silicon-insulator interface reduces dangling bonds on the silicon-insulator interface. It is significant that the fluorine-introduction into the silicon-insulator interface reduces dangling bonds under the gate electrode 8, thereby adjusting a threshold Vt of the transistor.

In some cases, the center of projected range of depth of the fluorine-ion-implantation is positioned at the interface between the first silicon oxide film 11 and the silicon nitride film 12 or positioned in the first silicon oxide film 11. This ion-implantation of fluorine into the silicon oxide film 11 or the interface 60 between the first silicon oxide film 11 and the silicon nitride film 12 may cause no damage or reduced damage that is applied to silicon in the source and drain diffusion regions 10a and 10b and in the p-type diffusion region under the gate electrode 8. No damage or reduced damage may suppress generation of silicon crystal defects in the source and drain diffusion regions 10a and 10b and in the p-type diffusion region under the gate electrode 8. This ion-implantation of fluorine into the silicon oxide film 11 or the interface 60 between the first silicon oxide film 11 and the silicon nitride film 12 may reduce the amount of fluorine ion implantation into the source and drain diffusion regions 10a and 10b and in the p-type diffusion region under the gate electrode 8. This may reduce damages to the silicon-insulator interface 50 between the gate insulating film 5 and the source/drain diffusion region 10 (10a) and the p-type diffusion region under the gate electrode 8.

With reference to FIG. 9, a first inter-layer insulator 18 is formed over the second silicon oxide film 14 and the polycrystalline silicon plugs 15. A typical example of the first inter-layer insulator 18 may include, but is not limited to, a silicon oxide film. In some cases, the first inter-layer insulator 18 may have a thickness of about 200 nanometers.

A first photo-resist film is applied on the first inter-layer insulator 18. The first photo-resist film is patterned to form a photo-resist pattern on the first inter-layer insulator 18. A dry etching process is carried out using the photo-resist pattern as a mask to selectively remove the first inter-layer insulator 18 and the second silicon oxide film 14, thereby forming a gate contact hole that is not illustrated. The gate contact hole penetrates the first inter-layer insulator 18 and the second silicon oxide film 14. The gate contact hole reaches the gate electrode 8. The gate contact hole is formed for allowing that a gate contact plug giving a potential to the gate electrode 8 is formed in the gate contact hole. The first photo-resist film is removed by a dry etching process.

A second photo-resist film is applied on the first inter-layer insulator 18. The second photo-resist film is patterned to form a photo-resist pattern on the first inter-layer insulator 18. A dry etching process is carried out using the photo-resist pattern as a mask to selectively remove the first inter-layer insulator 18, thereby forming a bit contact hole 18a in the first inter-layer insulator 18. The bit contact hole 18a reaches the top of the polycrystalline silicon plug 15 which contacts with the source diffusion region 10a. The second photo-resist film is removed by a dry etching process.

The semiconductor device includes not only the memory cell area but also a peripheral circuit area which is not illustrated. The memory cell area and the peripheral circuit area include the gate contacts and the bit contacts. The gate contacts and the bit contacts in the memory cell area and the peripheral circuit area are formed through the same processes. In the processes for forming the gate contact hole and the bit contact hole 18a, there are formed gate contact holes and bit contact holes. In the peripheral circuit area, each gate contact hole penetrates the first inter-layer insulator 18 and the second silicon oxide film 14 and reaches a gate electrode of a transistor in the peripheral circuit area. Each bit contact hole penetrates the first inter-layer insulator 18 and the second silicon oxide film 14 and reaches a source/drain diffusion region of a transistor in the peripheral circuit area.

A barrier metal layer is formed by a chemical vapor deposition process so that the barrier metal layer extends over the first inter-layer insulator 18 as well as on side and bottom walls of each of the bit contact hole 18a and the gate contact hole that is not illustrated. In some cases, the barrier metal layer may have, but is not limited to, a multi-layered structure, such as a stack of a titanium (Ti) layer and a titanium nitride (TiN) layer. Namely, the titanium (Ti) layer may be formed by a chemical vapor deposition process so that the titanium (Ti) layer extends over the first inter-layer insulator 18 as well as on side and bottom walls of each of the bit contact hole 18a and the gate contact hole that is not illustrated. The titanium nitride (TiN) layer may be formed on the titanium (Ti) layer. A typical example of the thickness of the titanium (Ti) layer may be, but is not limited to, 11 nanometers. A typical example of the thickness of the titanium nitride (TiN) layer may be, but is not limited to, 13 nanometers. A tungsten film is formed on the titanium nitride (TiN) layer, so that the tungsten film fills up the bit contact hole 18a and extends over the titanium nitride (TiN) layer. A typical example of the thickness of the tungsten film may be, but is not limited to, about 200 nanometers. A chemical mechanical polishing process is carried out to selectively remove a stack of the titanium (Ti) layer, the titanium nitride (TiN) layer, and the tungsten film over the first inter-layer insulator 18, while leaving the stack thereof in the bit contact hole 18a, thereby forming a bit contact plug 16. The bit contact plug 16 is the residual portion of the stack in the bit contact hole 18a The bit contact plug 16 contacts with the top of the polycrystalline silicon plug 15 which contacts with the source diffusion region 10a.

A tungsten nitride film is formed by a sputtering process over the first inter-layer insulator 18, the bit contact plug 16 and the gate contact plug. A typical example of the thickness of the tungsten nitride film may be, but is not limited to, about 10 nanometers. A tungsten film is formed by the sputtering process over the tungsten nitride film, thereby forming a stack of the tungsten nitride film and the tungsten film. A typical example of the thickness of the tungsten film may be, but is not limited to, about 40 nanometers. The stack of the tungsten nitride film and the tungsten film extends over the first inter-layer insulator 18, the bit contact plug 16 and the gate contact plug.

A third photo-resist film is applied on the stack of the tungsten nitride film and the tungsten film. The third photo-resist film is patterned by a lithography process, thereby forming a photo-resist pattern over the first inter-layer insulator 18. A dry etching process is carried out by using the photo-resist pattern as a mask for selectively removing the stack of the tungsten nitride film and the tungsten film, thereby forming a bit line 17. The bit line 17 extends over the first inter-layer insulator 18, wherein the bit line 17 contacts with the top of the bit contact plug 16. The bit line 17 is electrically connected through the bit contact plug 16 and the polycrystalline silicon plug 15 to the source diffusion region 10a. A silicon nitride film is formed by a chemical vapor deposition process so that the silicon nitride film covers the bit line 17. The silicon nitride film may perform as a passivation film that protects the bit line 17 from oxidation. A typical example of the thickness of the silicon nitride film may be, but is not limited to, about 5 nanometers.

A second inter-layer insulator 18b of silicon oxide is formed by a plasma enhanced chemical vapor deposition process over the first inter-layer insulator 18, the bit contact plug 16 and the bit line 17. A typical example of the thickness of the second inter-layer insulator 18b may be, but is not limited to, about 500 nanometers. A chemical mechanical polishing process is carried out to planarize the surface of the second inter-layer insulator 18b, so that the second inter-layer insulator 18b has a planarized surface. In some cases, the distance between the planarized surface of the second inter-layer insulator 18b and the top of the bit line 17 may be, but is not limited to, about 300 nanometers.

A fourth photo-resist film is applied on the second inter-layer insulator 18b. The fourth photo-resist film is patterned by a lithography process, thereby forming a photo-resist pattern over the first inter-layer insulator 18. A dry etching process is carried out by using the photo-resist pattern as a mask for selectively removing the second inter-layer insulator 18b and the first inter-layer insulator 18, thereby forming capacitor contact holes 19. The capacitor contact holes 19 penetrate the stack of the second and first inter-layer insulators 18b and 18. The capacitor contact holes 19 reach the tops of the polycrystalline silicon plugs 15 which contact with the drain diffusion regions 10b. The capacitor contact holes 19 are formed for allowing that the capacitor contact plugs 20 are formed in the capacitor contact holes 19, and the capacitor contact plugs 20 contact with the tops of the polycrystalline silicon plugs 15 which contact with the drain diffusion regions 10b.

An impurity-doped silicon film is formed over the second inter-layer insulator 18b and filling up the capacitor contact holes 19. A typical example of the impurity-doped silicon film may include, but is not limited to, a phosphorus-doped polycrystalline silicon film and a phosphorus-doped amorphous silicon film. An etch back process and a subsequent chemical mechanical polishing process are carried out to selectively remove the impurity-doped silicon film over the second inter-layer insulator 18b, while leaving the impurity-doped silicon film in the capacitor contact holes 19, thereby forming capacitor contact plugs 20. In some cases, the etch-back process can be realized by a dry etching process using chlorine plasma gas. The capacitor contact plugs 20 contact with the tops of the polycrystalline silicon plugs 15 which contact with the drain diffusion regions 10b. The capacitor contact plugs 20 are electrically connected through the polycrystalline silicon plugs 15 to the drain diffusion regions 10b.

In some cases, a typical example of the impurity concentration of the impurity-doped silicon film may be, but is not limited to, in the range of 1E20 atms/cm$^3$ to 4.5E20 atms/cm$^3$. The chemical mechanical polishing process may etch the planarized surface of the second inter-layer insulator 18b, thereby reducing the thickness of the second inter-layer insulator 18b, and resulting in that the distance between the top surface of the second inter-layer insulator 18b and the top of the bit line 17 may be about 200 nanometers.

A silicon nitride film 21 is formed over the second inter-layer insulator 18b and the capacitor contact plugs 20. The silicon nitride film 21 performs as an etching stopper. A third silicon oxide film 22 is formed over the silicon nitride film 21.

The third silicon oxide film 22 performs as the cores of cylinders for capacitors. A typical example of the thickness of the third silicon oxide film 22 may be, but is not limited to, about 3 micrometers. A stack of the silicon nitride film 21 and the third silicon oxide film 22 forms a third inter-layer insulator 23 that extends over the second inter-layer insulator 18b and the capacitor contact plugs 20.

A fifth photo-resist film is applied over the third inter-layer insulator 23. The fifth photo-resist film is patterned by a lithography process, thereby forming a photo-resist pattern over the third inter-layer insulator 23. A dry etching process is carried out by using the photo-resist pattern as a mask for selectively removing the third inter-layer insulator 23, thereby forming a cylindrically shaped capacitor hole 24 in the third inter-layer insulator 23. The capacitor hole 24 reaches the capacitor contact plugs 20 and the second inter-layer insulator 18b. The capacitor hole 24 has an inside wall and an outside wall as all as a ring-shaped bottom. The capacitor hole 24 is formed for allowing a capacitor is formed therein.

In order to suppress the resistance between the bottom electrode and the capacitor contact plugs 20, a spontaneous oxide film is removed by a wet etching using a fluoride solution An impurity-doped silicon film 25 is formed by a chemical vapor deposition process on the side and bottom walls of the capacitor hole 24 as well as over the top surface of the third inter-layer insulator 23. A typical example of the impurity-doped silicon film 25 may include, but is not limited to, an impurity-doped polycrystalline silicon film and an impurity-doped amorphous silicon film. A typical example of the thickness of the impurity-doped silicon film 25 may be, but is not limited to, in the range of 25 nanometers to 35 nanometers. A typical example of the impurity concentration of the impurity-doped silicon film 25 may be, but is not limited to, about 4.4E20 atoms/cm$^3$.

A positive-type photo-resist is applied on the surface of the impurity-doped silicon film 25. An exposure process is carried out to expose the positive-type photo-resist except in the capacitor hole 24. A development process is then carried out to selectively remove the positive-type photo-resist except in the capacitor hole 24, thereby forming a resist pattern in the capacitor hole 24. An etch-back process is carried out using the resist pattern as a mask to selectively remove the impurity-doped silicon film 25 from the top surface of the third inter-layer insulator 23, thereby leaving the impurity-doped silicon film 25 in the capacitor hole 24. The etch-back process can be carried out by an anisotropic etching process using Cl. The resist pattern is removed by a dry etching process and a wet etching process.

A metal bottom electrode film 26 is selectively formed on the impurity-doped silicon film 25 in the capacitor hole 24. In some cases, the metal bottom electrode film 26 may have a multi-layered structure. The metal bottom electrode film 26 may include, but is not limited to, a stack of a titanium film and a titanium nitride film. In an example, the metal bottom electrode film 26 can be formed as follows. A titanium film can be formed on the impurity-doped silicon film 25 as a third silicon film by a high temperature plasma enhanced chemical vapor deposition process. A typical example of the thickness of the titanium film can be, but is not limited to, 10 nanometers. A titanium nitride film can further be formed on the titanium film by a thermal chemical vapor deposition process. A typical example of the thickness of the titanium nitride film can be, but is not limited to, 20 nanometers.

In some cases, the high temperature plasma enhanced chemical vapor deposition process can be carried out at 650° C. so as to cause in-situ silicidation of the titanium film with silicon of the impurity-doped silicon film 25, thereby forming a titanium silicide (TiSi$_2$) film 25a between the titanium film and the impurity-doped silicon film 25. The titanium silicide (TiSi$_2$) film 25a can be formed along the bottom and side walls of the capacitor hole 24 because the impurity-doped silicon film 25 extends along the bottom and side walls of the capacitor hole 24. The impurity-doped silicon film 25 extending along the bottom and side walls of the capacitor hole 24 ensures sufficiently large contact area between the titanium film and the impurity-doped silicon film 25, thereby ensuring sufficiently large area of the titanium silicide (TiSi$_2$) film 25a. Such sufficiently large area of the titanium silicide (TiSi$_2$) film 25a reduces the contact resistance between the capacitor and the capacitor contact.

Materials, thickness and formation method for the metal bottom electrode film 26 are not limited to the above-described examples.

In order to obtain good contact characteristics, it is preferable that the thickness of the impurity-doped silicon film 25 as the third silicon film is ranged from about 20 nanometers to about 40 nanometers, and particularly it is preferable that the thickness of the titanium film included in the metal bottom electrode film 26 is ranged from about 10 nanometers to about 15 nanometers.

When the thickness of the impurity-doped silicon film 25 as the third silicon film largely exceeds over 40 nanometers as the upper limit of the preferable thickness range thereof, it is suitable for forming the titanium silicide (TiSi$_2$) film 25a but it is unsuitable to reduce the capacitance of the capacitor. When the thickness of the impurity-doped silicon film 25 as the third silicon film is thinner than 15 nanometers, it is unsuitable to ensure the sufficient thickness of the titanium silicide (TiSi$_2$) film 25a. Insufficient thickness of the titanium silicide (TiSi$_2$) film 25a can allow increased contact resistance between the capacitor and the capacitor contact and can not ensure good contact characteristics.

When the thickness of the titanium film included in the metal bottom electrode film 26 exceeds over 20 nanometers as the upper limit of the preferable thickness range thereof, excess silicidation reaction can be caused. When the thickness of the titanium film included in the metal bottom electrode film 26 is thinner than 5 nanometers, it is unsuitable to ensure the sufficient thickness of the titanium silicide (TiSi$_2$) film 25a. Insufficient thickness of the titanium silicide (TiSi$_2$) film 25a can allow increased contact resistance between the capacitor and the capacitor contact and can not ensure good contact characteristics.

The metal bottom electrode film 26 can be patterned as follows. A positive-type photo-resist is applied on the surface of the metal bottom electrode film 26. An exposure process is carried out to expose the positive-type photo-resist except in the capacitor hole 24. A development process is then carried out to selectively remove the positive-type photo-resist except in the capacitor hole 24, thereby forming a resist pattern in the capacitor hole 24. An etch-back process is carried out using the resist pattern as a mask to selectively remove the impurity-doped silicon film 25 from the top surface of the third inter-layer insulator 23, thereby leaving the metal bottom electrode film 26 in the capacitor hole 24. The etch-back process can be carried out by an anisotropic etching process using Cl. The resist pattern is removed by a dry etching process and a wet etching process using an organic peeling solution.

A stack of the titanium film and the titanium nitride film forms the metal bottom electrode film 26. A stack of the metal bottom electrode film 26 and the impurity-doped silicon film 25 forms a bottom electrode 27. The bottom electrode 27 extends along the bottom and side walls of the capacitor hole 24. Namely, the bottom electrode 27 is formed along the inside and outside walls and the ring-shaped bottom of the capacitor hole 24. The bottom electrode 27 contacts with the capacitor contact plugs 20. The bottom electrode 27 is electrically connected through the capacitor contact plugs 20 and the polycrystalline silicon plugs 15 to the drain diffusion regions 10b.

A capacitive insulation film 28 is formed on the surface of the bottom electrode 27 and over the third inter-layer insulator 23. Namely, the capacitive insulation film 28 extends along the bottom electrode 27. In some cases, the capacitive insulation film 28 can be made of a dielectric film having a high dielectric constant. Typical examples of the capacitive insulation film 28 may include, but are not limited to, an $Al_2O_3$ film, an $HfO_2$ film, a $Ta_2O_5$ film and other oxide films. A typical example of the thickness of the capacitive insulation film 28 may be, but not limited to, a few nanometers.

A top electrode 29 is formed on the surface of the capacitive insulation film 28. Namely, the top electrode 29 extends along the capacitive insulation film 28. A typical example of the top electrode 29 may be, but is not limited to, a titanium nitride (TiN) film. A capacitive plate 30 is formed which fills up the cylindrically shaped groove residing in the capacitor hole 24 and which extends over the top surface of the top electrode 29 being positioned over the third inter-layer insulator 23. A typical example of the capacitive plate 30 may be, but is not limited to, a tungsten (W) plate. An MIM (metal-insulator-metal) structure is formed by a set of the metal bottom electrode film 26, the capacitive insulation film 28, the top electrode 29, and the capacitive plate 30. The MIM (metal-insulator-metal) structure is formed on the impurity-doped silicon film 25 as the third silicon film. A memory cell capacitor is formed by a set of the bottom electrode, 27, the capacitive insulation film 28, the top electrode 29, and the capacitive plate 30.

The above-described semiconductor device can be modified in materials for each element thereof, and in the thicknesses of the films and layers thereof. The above-described processes for forming the semiconductor device can be modified.

The interface state of the silicon-insulator interface 50 between the gate insulating film 5 and the source/drain diffusion region 10 (10a) is reduced by fluorine that has been introduced into the silicon-insulator interface silicon-insulator interface 50. This structure can be applied to a memory cell transistor of DRAM, thereby decreasing the leakage of current and improving the refresh performance.

EXAMPLE

An n-type MOSFET (Metal Oxide Semiconductor Field Effect Transistor) was prepared in accordance with the processes shown in FIGS. 1-6.

With reference to FIG. 1, a silicon substrate 1 was prepared. A groove was formed in a shallow portion of the silicon substrate 1, wherein the groove isolates or defines an active region of the silicon substrate 1. A buried insulating film 2 was formed in the groove of the silicon substrate 1 so as to isolate the active region of the silicon substrate 1. A silicon oxide film 3 having a thickness of 10 nanometers was formed on the surface of the silicon substrate 1 by a thermal oxidation process.

An ion-implantation process was carried out to introduce boron into the active region of the silicon substrate 1 through the silicon oxide film 3, thereby forming a p-type diffusion layer 4 in the active region of the semiconductor substrate 1. The ion-implantation process was carried out under first conditions at acceleration energy of 300 keV and a dose of $1E13/cm^2$, under second conditions at acceleration energy of 100 keV and a dose of $5E12/cm^2$, and third conditions at acceleration energy of 15 keV and a dose of $1E13/cm^2$.

With reference to FIG. 2, after the silicon oxide film 3 was removed, a gate insulating film 5 having a thickness of 7 nanometers was formed on the surface of the p-type diffusion layer 4. A polycrystalline silicon film 6 being doped with phosphorus at a high concentration and having a thickness of 70 nanometers was formed over the gate insulating film 5. A tungsten silicide film 7 having a thickness of 100 nanometers was formed over the polycrystalline silicon film 6.

With reference to FIG. 3, a stack of the tungsten silicide film 7 and the polycrystalline silicon film 6 was selectively removed by patterning process, thereby forming a gate electrode 8. Side wall insulating films 9 having a thickness of about 10 nanometers were formed on the side walls of the gate electrode 8 by a thermal oxidation process. A phosphorus-implantation process was carried out at acceleration energy of 20 keV and a dose of $1E13/cm^2$ by using the gate electrode 8 and the gate side walls 9 as a mask, so as to selectively introduce phosphorus into the p-type diffusion layer 4 through the gate insulating film 5. A heat treatment was then carried out for 10 seconds at 900° C. in a nitrogen atmosphere, thereby causing thermal diffusion of implanted phosphorus and forming n-type diffusion regions 10 in the p-type diffusion layer 4.

With reference to FIG. 4, a first silicon oxide film 11 having a thickness of 10 nanometers was formed which covers the gate insulating film 5, the side wall insulating films 9 and the gate electrode 8. A silicon nitride film 12 having a thickness of 20 nanometers was formed on the first silicon oxide film 11, thereby forming a passivation film 13 that is a stack of the first silicon oxide film 11 and the silicon nitride film 12. The passivation film 13 covers the gate insulating film 5, the side wall insulating films 9 and the gate electrode 8.

A fluorine-ion-implantation process can be carried out at acceleration energy of 10 keV and a dose of $1E14/cm^2$, where the center of projected range of depth of the fluorine-ion-implantation is adjusted to the interface 60 between the first silicon oxide film 11 and the silicon nitride film 12, resulting in that the first silicon oxide film 11 has a fluorine concentration of $2E19/cm^3$.

A heat treatment was carried out at 700° C. for 60 minutes, so as to cause that fluorine from the first silicon oxide film 11 is thermally diffused into the silicon-insulator interface 50 between the gate insulating film 5 and the source and drain diffusion regions 10a and 10b and the p-type diffusion region under the gate electrode 8, while the silicon nitride film 12 having performed as an outward diffusion stopper that prevents the implanted fluorine from being diffused outwardly. The silicon nitride film 12 allowed efficiently introducing fluorine into the interface between the first silicon oxide film 11 and the silicon nitride film 12.

The above method of introducing fluorine has reduced the amount of implanted fluorine into the diffusion regions 10 and the semiconductor substrate 1 under the gate electrode 8, thereby suppressing generation of crystal defects in the diffusion regions 10 and the semiconductor substrate 1 under the gate electrode 8.

With reference to FIG. 5, a second silicon oxide film 14 as an inter-layer insulator is formed over the passivation film 13.

With reference to FIG. 6, contact holes 14a were formed by patterning process, so that the contact holes 14a penetrate the second silicon oxide film 14, the passivation film 13, and the gate insulating film 5. A polycrystalline silicon film having a high phosphorus-concentration was deposited to fill up the contact holes 14a and to extend over the second silicon oxide film 14. The polycrystalline silicon film was etched back to form polycrystalline silicon plugs 15 in the contact holes 14a. As a result, a first transistor with the fluorine-introduced silicon-insulator interface having reduced interface state was formed.

As a comparative example, the same processes as described above, except for no fluorine implantation, were carried out to form a second transistor with a fluorine-free silicon-insulator interface having unreduced interface state was formed.

First and second DRAMs as shown in FIG. 9 were prepared using the first and second transistors, respectively. The first DRAM with the first transistor having the fluorine-introduced silicon-insulator interface having reduced interface state is the DRAM of the example of the present invention. The second DRAM with the second transistor having the fluorine-free silicon-insulator interface having unreduced interface state is the DRAM of the comparative example.

Figure 8:
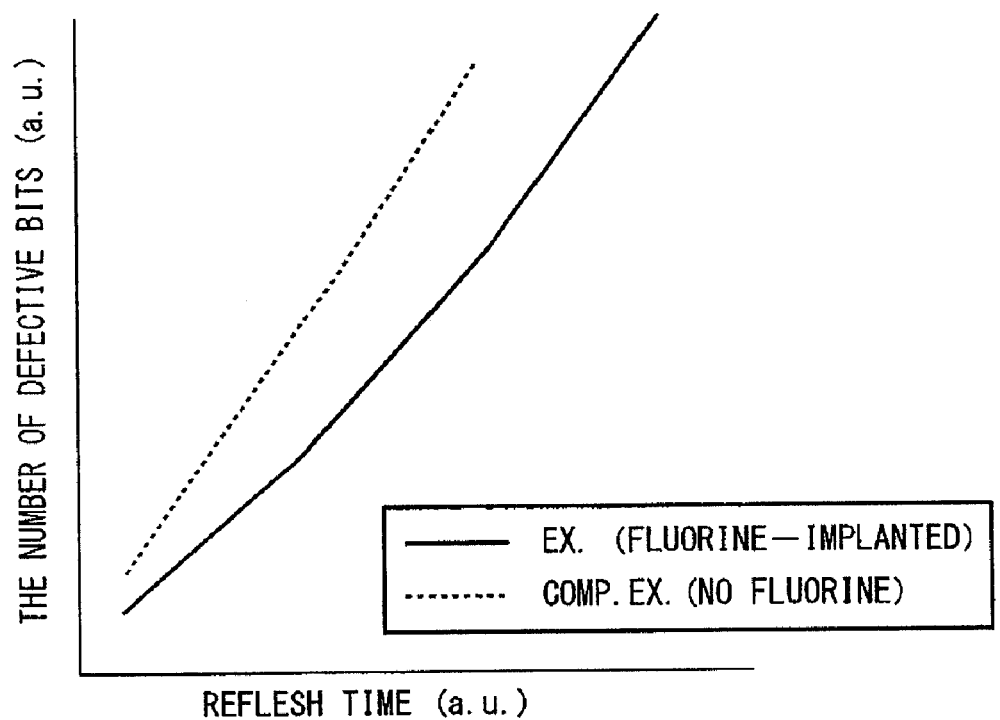
FIG. 8 is a diagram illustrating relationships between the number of defective bits over refresh time when "1" is stored into all of 512M-bits of DRAM memory cells in the example of the present invention and in the comparative example.

FIG. 8 is a diagram illustrating relationships between the number of defective bits over refresh time when "1" is stored into all of 512M-bits of DRAM memory cells in the example of the present invention and in the comparative example. "a.u." represents arbitrary unit. The real line represents refresh performance of the first DRAM with the first transistor having the fluorine-introduced silicon-insulator interface having reduced interface state in accordance with the example of the present invention. The dotted line represents refresh performance of the second DRAM with the second transistor having the fluorine-free silicon-insulator interface having unreduced interface state in accordance with the comparative example.

The first DRAM in accordance with the example of the present invention is lower in the number of defective bits than the second DRAM in accordance with the comparative example.

It was demonstrated that fluorine that is introduced into the silicon-insulator interface reduces interface state of the silicon-insulator interface, thereby reducing the leakage of current and improving the refresh performance when the present invention is applied to the memory cell transistor of the DRAM.

The present invention can be applicable to, but not limited to, a DRAM memory cell transistor that needs reduced power consumption.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device comprising:
   a transistor including source and drain regions, and a gate electrode;
   a first insulating film covering the transistor, and being doped with fluorine;
   a second insulating film covering the first insulating film;
   a contact hole penetrating the first insulating film and the second insulating film to expose a part of at least one of the source and drain regions; and
   a contact plug filling the contact hole, the contact plug being in contact with the part of at least one of the source and drain regions,
   wherein the first insulating film includes a third insulating film and a fourth insulating film, the fourth insulating film being disposed between the third insulating film and the second insulating film, and the fourth insulating film prevents the fluorine from diffusing from the third insulating film toward the second insulating film.

2. The semiconductor device according to claim 1, wherein the third insulating film comprises a silicon oxide film, and the fourth insulating film comprises a silicon nitride film.

3. A semiconductor device comprising:
   source and drain regions selectively formed in a semiconductor layer to define a channel region therebetween;
   a gate insulating layer formed continuously on surfaces of the source, drain and channel regions, the gate insulating layer thereby including a first portion corresponding to the source region, a second portion corresponding to the drain region and a third portion corresponding to the channel region, respective interfaces between the first portion of the gate insulating film and the source region and between the second portion of the gate insulating film and the drain region contain with fluorine;
   a gate electrode structure formed on the third portion of the gate insulating film, the gate electrode structure including top and side surfaces; and
   a passivation film formed continuously in direct contact with the first and second portions of the gate insulating film and the top and side surfaces of the gate electrode structure, the passivation film containing fluorine therein,
   wherein the passivation film includes a silicon oxide film and a silicon nitride film, the silicon oxide film is sandwiched between each of the gate insulating film and the gate electrode and the silicon nitride film, the silicon oxide film is directly in contact with each of the gate insulating film and the gate electrode.

4. The semiconductor device according to claim 3, further comprising;
   a contact plug penetrating at least one of the first and second portions of the gate insulating film and the passivation film to touch a corresponding one of the source and drain regions.

* * * * *